(12) United States Patent
Gorzel et al.

(10) Patent No.: US 10,674,301 B2
(45) Date of Patent: Jun. 2, 2020

(54) FAST AND MEMORY EFFICIENT ENCODING OF SOUND OBJECTS USING SPHERICAL HARMONIC SYMMETRIES

(71) Applicant: GOOGLE LLC, Mountain View, CA (US)

(72) Inventors: Marcin Gorzel, Dublin (IR); Andrew Allen, New York, NY (US)

(73) Assignee: Google LLC, Mountain View, CA (US)

( * ) Notice: Subject to any disclaimer, the term of this patent is extended or adjusted under 35 U.S.C. 154(b) by 11 days.

(21) Appl. No.: 16/108,385

(22) Filed: Aug. 22, 2018

(65) Prior Publication Data

US 2019/0069110 A1     Feb. 28, 2019

Related U.S. Application Data

(60) Provisional application No. 62/550,383, filed on Aug. 25, 2017.

(51) Int. Cl.
| | |
|---|---|
| *H04S 5/00* | (2006.01) |
| *H04S 3/00* | (2006.01) |
| *H04S 7/00* | (2006.01) |
| *G10L 19/008* | (2013.01) |
| *H03G 3/30* | (2006.01) |

(52) U.S. Cl.
CPC ............ *H04S 5/005* (2013.01); *G10L 19/008* (2013.01); *H04S 3/00* (2013.01); *H04S 3/008* (2013.01); *H04S 7/304* (2013.01); *H03G 3/301* (2013.01); *H04S 2400/11* (2013.01); *H04S 2400/15* (2013.01); *H04S 2420/01* (2013.01); *H04S 2420/11* (2013.01)

(58) Field of Classification Search
None
See application file for complete search history.

(56) References Cited

U.S. PATENT DOCUMENTS

| | | | |
|---|---|---|---|
| 2014/0344766 | A1 | 12/2014 | Morrell et al. |
| 2014/0344769 | A1 | 12/2014 | Peters et al. |
| 2016/0035356 | A1 | 2/2016 | Morrell et al. |
| 2017/0105085 | A1* | 4/2017 | Kim ........................ H04S 7/308 |

FOREIGN PATENT DOCUMENTS

| | | |
|---|---|---|
| WO | 2011117399 A1 | 9/2011 |
| WO | 2016048894 A1 | 3/2016 |
| WO | 2017157803 A1 | 9/2017 |

OTHER PUBLICATIONS

International Search Report and Written Opinion dated Oct. 12, 2018 for corresponding International Application No. PCT/US2018/047878, 17 pages.
International Preliminary Report on Patentability dated Mar. 5, 2020 for corresponding International Application No. PCT/US2018/047878, 9 pages.

* cited by examiner

*Primary Examiner* — Paul W Huber

(57) ABSTRACT

A method of encoding sound objects includes receiving a set of monophonic sound inputs. Each of the set of monophonic sound inputs includes position and orientation information of a sound object relative to a source position. The set of monophonic sound inputs are encoded into a higher order ambisonic (HOA) sound field in a spherical harmonics domain based on a spherical harmonics dataset including a subset of all spherical harmonic coefficients for a given subset of azimuth and elevation angles. Some embodiments include decoding the HOA sound field to generate a set of loudspeaker signals.

20 Claims, 5 Drawing Sheets

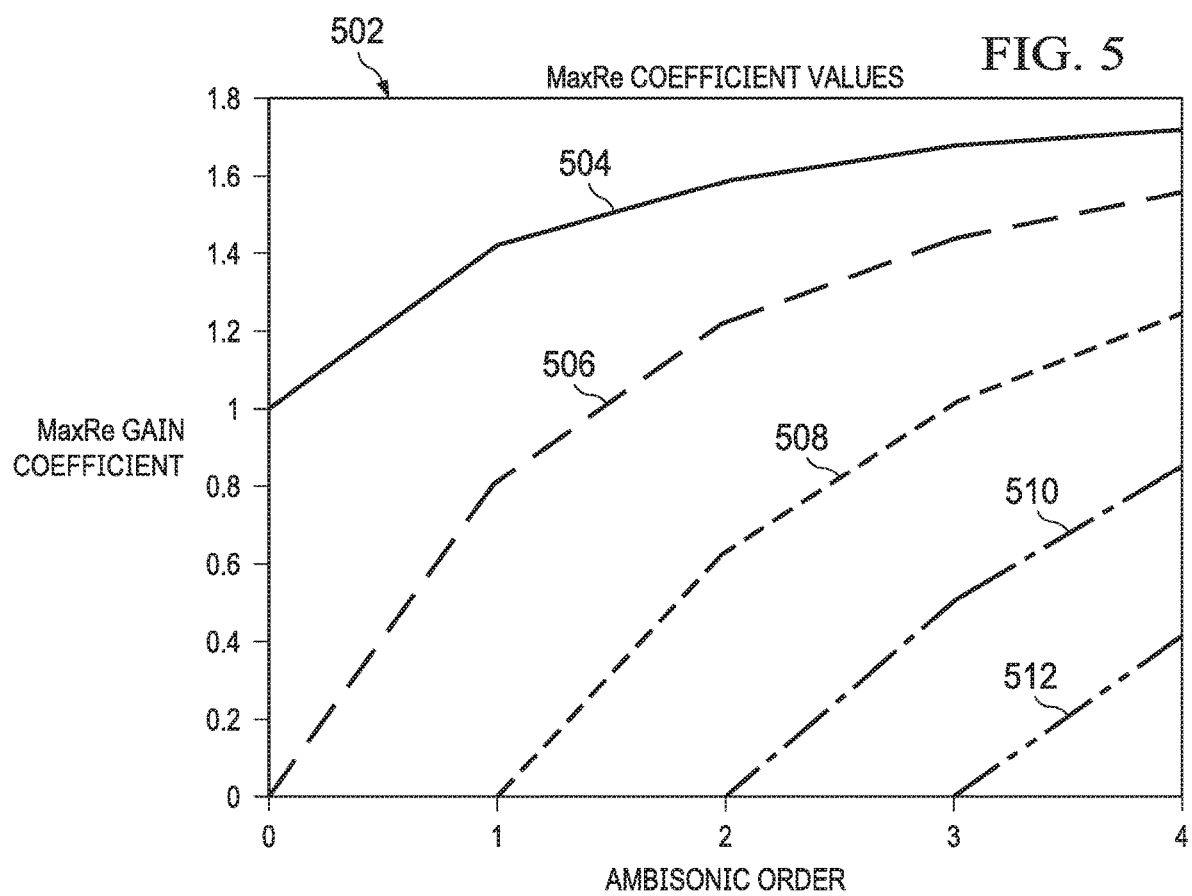

FAST AND MEMORY EFFICIENT ENCODING OF SOUND OBJECTS USING SPHERICAL HARMONIC SYMMETRIES

CROSS REFERENCE TO RELATED APPLICATIONS

This application is related to U.S. Provisional Patent Application 62/550,383, entitled "FAST AND MEMORY EFFICIENT ENCODING OF SOUND OBJECTS USING SPHERICAL HARMONIC SYMMETRIES" and filed on Aug. 25, 2017, the entirety of which is incorporated by reference herein.

BACKGROUND

As the web and mobile devices emerge as virtual reality (VR) and augmented reality (AR) platforms for delivering content, spatial audio will play an increasing role in the user's experience. For virtual scenes to be perceived as immersive, visual imagery should be accompanied by spatial audio to present realistic VR experiences. Spatial audio allows the perception of sounds that can come from any direction, and that are associated in 3D space with audio sources, thus enveloping the user in 360-degree sound. The usage of spatial audio helps draw the user into a scene and creates the illusion of entering a virtual world as presented in VR/AR.

BRIEF DESCRIPTION OF THE DRAWINGS

The present disclosure may be better understood, and its numerous features and advantages made apparent to those skilled in the art by referencing the accompanying drawings. The use of the same reference symbols in different drawings indicates similar or identical items.

FIG. 5 is a graph illustrating gain values to be applied to each Ambisonic channel of a given Ambisonic order in accordance with some embodiments.

DETAILED DESCRIPTION

Figure 1:
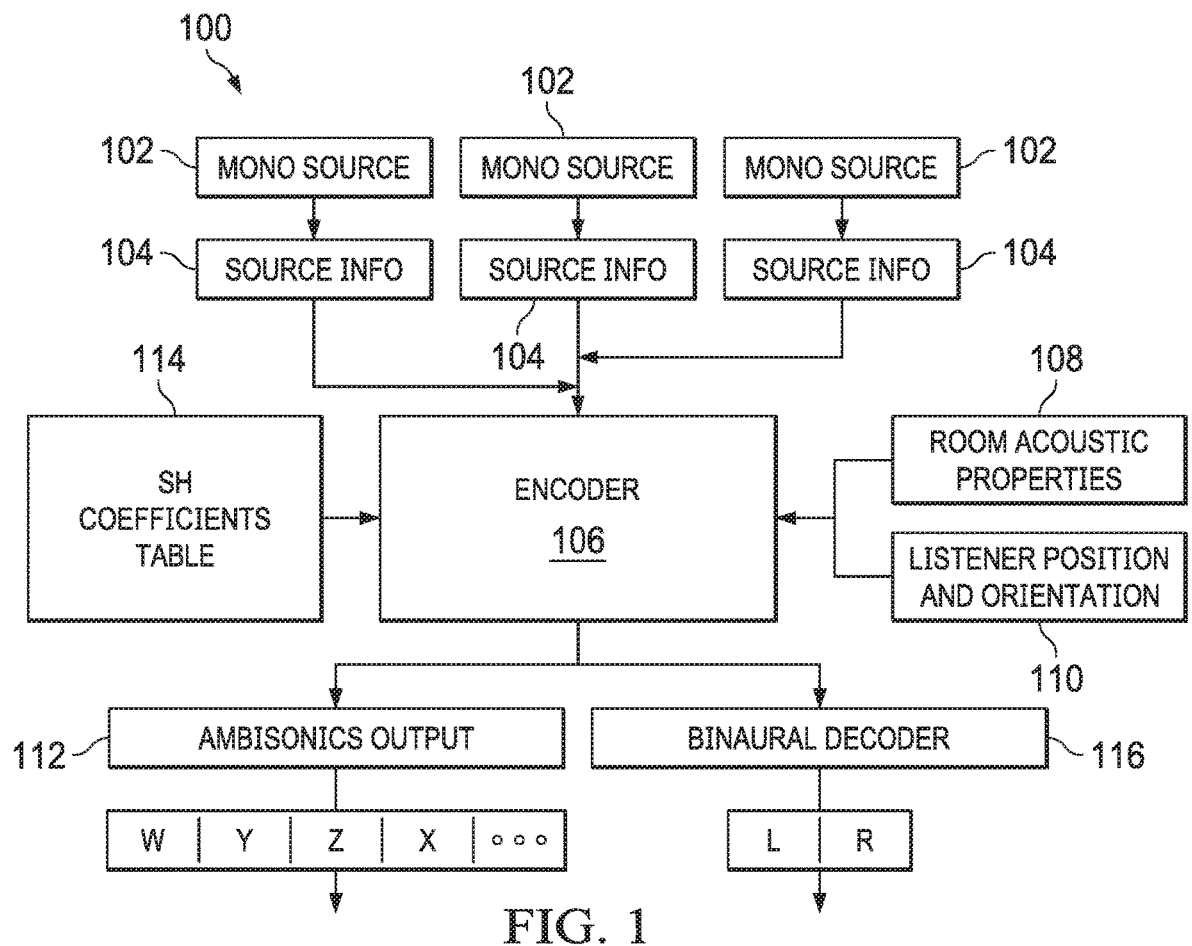
FIG. 1 is a diagram illustrating audio processing for encoding of sound objects into Higher Order Ambisonic (HOA) sound fields and decoding of HOA sound fields into binaural stereo signals in accordance with some embodiments.

Higher Order Ambisonics (HOA) refers to a set of spatial audio techniques for capturing, manipulating and reproducing sound scenes, based on a spherical Fourier expansion of the sound field. Ambisonic sound fields have an "order" which corresponds to the level of spatial detail provided. The order determines the number of channels present—new channels are added on each time the order is increased. At "zero" order, there is just one mono channel. At first order, as described above, there are three additional spatial channels (totaling four), each behaving like a figure-of-eight microphone. At second order, another five channels are added (totaling nine), and so on. It will be appreciated that the channels correspond to the spherical harmonics which arise in solutions to the Acoustic Wave Equation in spherical polar coordinates.

Some approaches to spatial audio coding (e.g., surround-sound coding) include scene-based audio, which involves representing a sound field using coefficients of spherical harmonic basis functions. Such coefficients are also called "spherical harmonic coefficients" or SHC. Higher Order Ambisonics (HOA) offers the advantage of representing a complete sound field in the vicinity of a specific location in three-dimensional (3D) space. Such HOA representation is independent of any specific loudspeaker set-up, in contrast to techniques such as stereo- or surround-sound. However, this flexibility is at the expense of computational resources related to a decoding process required for playback of the HOA representation particular to different loudspeaker set-ups.

FIGS. 1-5, as described in further detail below, illustrate techniques for digital signal processing (DSP) for the encoding and decoding of binaural sound sources. In some embodiments, a method of encoding of sound objects into HOA sound fields includes receiving a set of monophonic sound inputs, wherein each of the monophonic sound inputs includes position and orientation information of a sound object relative to a source position (e.g., a center of a sphere). The set of monophonic sound inputs are encoded, based on a spherical harmonics lookup table including a subset of all spherical harmonic coefficients for a given subset of azimuth and elevation angles, into a higher order ambisonic (HOA) sound field in a spherical harmonics domain. A binaural sound output is generated by decoding the HOA sound field to generate a set of loudspeaker signals and convolving two or more of the generated sets of loudspeaker signals and summing a left channel signal and a right channel signal. In some embodiments, the spherical harmonics lookup table is computed prior to performing sound object encoding. For example, the computing of the spherical harmonics lookup table includes computing a first sphere quadrant of all spherical harmonic coefficients. Afterwards, a SHC of a second sphere quadrant is retrieved from the spherical harmonics lookup table based on a symmetry look-up table containing SHC symmetry information. Further, to control source sound spread, a gain correction is applied to each of a plurality of Ambisonic channels of the HOA sound field to change a source spread of the sound object and an energy-preserving gain correction is applied to each of a plurality of Ambisonic channels of the HOA sound field to maintain a total energy level of the HOA sound field.

FIG. 1 is a diagram illustrating audio processing for encoding of sound objects into Higher Order Ambisonic sound fields in accordance with some embodiments. As shown, an audio processing pipeline 100 includes a plurality of monophonic (hereinafter, "mono") sound sources 102 provided as input signals into the audio processing pipeline 100. As used herein, the mono sound sources include, but are not limited to: directional (i.e., single channel) sound recordings, such as sharply parabolic sound recordings; sound recordings with discrete or nearly-discrete spatial direction; sound recordings where actual spatial information is constrained to a discrete or nearly-discrete spatial direction; sound recordings where actual spatial information is disregarded and replaced by artificially generated spatial information; and, as for example in a virtual reality environment, a generated sound with a virtual source position and direction. Further, any sound source may be interpreted as a monophonic input signal by disregarding any known spatial information for an actual (i.e., recorded) sound signal treating it as a monophonic signal which can then be associated with generated spatial information.

Each mono sound source 102 is provided along with source information 104, which includes source position and orientation information for modeling acoustic sound sources, to an encoder 106. In some embodiments, the source information 104 for each mono sound source 102 includes associated spatial object parameters, which positions the mono sound source 102 in a Cartesian coordinate system relative to an origin position (e.g., center of a room or other user-defined origin in the virtual environment that the listener is in).

In various embodiments, the operations of encoder 106 includes encoding audio channels (e.g., mono sound sources 102) into an Ambisonics format, AmbiX, A-format, or other higher-order Ambisonics for representing three-dimensional sound fields. Ambisonics is a full-sphere surround sound technique that covers sound sources above and below the listener, in addition to the horizontal plane. Unlike other multi-channel surround formats, Ambisonics transmission channels do not carry speaker signals. Instead, Ambisonics transmission channels contain a speaker-independent representation of a sound field, which is later decoded according to a listener's particular speaker setup. This offers the listener a considerable degree of flexibility as to the layout and number of speakers used for playback.

In some embodiments, the audio processing pipeline 100 uses the AmbiX Ambisonics convention for encoding and decoding of sound objects. The AmbiX convention imposes the use of Schmidt semi-normalization (SN3D) and Ambisonic Channel Number (ACN) sequencing of spherical harmonics. In the spatial audio field for Ambisonics, the terms "order" is usually denoted as n (also referred to as Ambisonic order) and "degree" is usually denoted as m (also referred to as Ambisonic degree). With Ambisonics, the 3D spherical coordinate system is normally set up so that X-axis direction is forwards, Y-axis direction is to the left, and Z-axis direction is upwards. The conversion between spherical and Cartesian coordinates is defined by the following equations:

$$x = \|\vec{r}\| \cos\phi \cos\theta \quad (1)$$

$$y = \|\vec{r}\| \sin\phi \cos\theta \quad (2)$$

$$z = \|\vec{r}\| \sin\theta \quad (3)$$

where $\phi$ is the azimuth angle with an anti-clockwise rotation and $\theta$ is the elevation angle calculated from the x-y plane.

The encoder 106 receives data representative of room acoustic properties 108 and listener position/orientation information 110. Directional components of room reverberation (i.e. early reflections) can be encoded into an Ambisonic sound field, similarly as other discrete sound sources. The room acoustic properties 108 controls characteristics of spatial reflections and reverberation, and the listener position/orientation information 110 provides listener position at the moment of encoding, thereby modeling a physical listener of the various mono sound sources 102. In some embodiments, the encoder 106 encodes one or more mono sound sources 102 in an Ambisonics output 112 (e.g., an Ambisonic sound field b) by multiplying a monophonic pressure signal corresponding to the sound source s by a vector Y with spherical harmonic coefficients $Y_n^m(\phi, \theta)$, as represented by the following equation:

$$b = sY \quad (4)$$

The spherical harmonic coefficients are defined by the following equation:

$$Y_n^m(\phi, \theta) = N_m^{|m|} P_n^{|m|}(\sin(\theta)) \begin{cases} \cos(|m|\phi) & \text{if } m \geq 0 \\ \sin(|m|\phi) & \text{if } m < 0 \end{cases} \quad (5)$$

where $\phi$ is the sound source horizontal angle and $\theta$ is the sound source vertical angle. Thus, the spherical harmonics are represented by $Y_n^m(\theta, \phi)$ in angular direction ($\theta$, $\phi$), in which $\theta$ denotes the longitudinal coordinate and $\phi$ denotes the latitudinal coordinate. Further, n is the Ambisonic order, m is the Ambisonic degree, and $P_n^{|m|}$ are the associated Legendre functions (with the Condon-Shortley phase undone). $N_n^{|m|}$ is the SN3D normalization term, which is determined according to the following equation:

$$N_m^{|m|} = \sqrt{(2 - \delta_m) \frac{(n - |m|)!}{(n + |m|)!}} \quad (6)$$

In some embodiments, the encoder 106 skips the $$\frac{1}{4\pi}$$

term in the normalization, thereby preserving the original source amplitude in the zeroth order spherical harmonic.

In general, the encoder 106 generates an Ambisonics output 112 (e.g., an ambisonic sound field) that can then be rendered for listening. The encoder 106 generally includes two parameters, azimuth and elevation angle, and distributes the mono sound sources 102 to the Ambisonics components such that, when decoded, the sources will appear at desired locations. For example, as illustrated in FIG. 1, the mono sound sources 102 are encoded into a first-order Ambisonics signal having four channels: W, X, Y and Z. In some embodiments, as discussed further below, the encoder 106 also includes a spread parameter related to an apparent size (e.g., width) of a sound source.

The W channel is the non-directional mono component of the ambisonics output 112, corresponding to the output of an omnidirectional microphone. The X, Y and Z channels are the directional components in three dimensions, which correspond respectively to the outputs of three figure-of-eight microphones, facing forward, to the left, and upward. The W channel corresponds to the sound pressure at a point in space in the sound field whilst the X, Y and Z channels correspond to the three components of the pressure gradient.

The four Ambisonic audio channels do not correspond directly to speaker feeds. Instead, the channels contain components of the sound field that are combined during a later decoding step. That is, loudspeaker signals are derived by using a linear combination of the Ambisonic audio channels, where each signal is dependent on the actual position of the speaker in relation to the center of an imaginary sphere the surface of which passes through all available speakers. Accordingly, the Ambisonic audio channels can be decoded for (or combined to produce feeds for) any loudspeaker reproduction array. Ambisonic sound fields allow multi-channel audio to be generated, recorded and transferred from place to place without worrying about the speakers that are going to be used for playback in the end. Ambisonic sound fields support full 3D too, as it captures essentially equal information in all directions and can be rotated quite easily. This makes it useful for VR and AR applications, because Ambisonic sound fields can be rotated into place before decoding, depending on where the user's head is pointing.

In some embodiments, the Ambisonics output 112 (e.g., Ambisonic sound field) is rendered using binaural decoder 116 to generate stereo output. That is, the multi-channel audio of the Ambisonics output 112 is decoded to 3D binauralized sound (e.g., a stereo track) for listening on regular, LR headphones. In one embodiment, the binaural decoder 116 multiplies the Ambisonic signal b by the inverse of the loudspeaker re-encoding matrix L, which encodes $i^{th}$ loudspeaker direction in the spherical harmonics, as represented by the following equation:

$$L = \begin{bmatrix} Y_0^0(\Phi_1, \theta_1) & Y_0^0(\Phi_i, \theta_i) & \ldots & Y_0^0(\Phi_N, \theta_N) \\ Y_1^{-1}(\Phi_1, \theta_1) & Y_1^{-1}(\Phi_i, \theta_i) & \ldots & Y_1^{-1}(\Phi_N, \theta_N) \\ \vdots & \vdots & \vdots & \vdots \\ Y_n^m(\Phi_1, \theta_1) & Y_n^m(\Phi_i, \theta_i) & \ldots & Y_n^m(\Phi_N, \theta_N) \end{bmatrix} \quad (7)$$

where $\Phi_i$ is the azimuth angle of the $i^{th}$ loudspeaker in the array and $\Theta_i$ is the vertical angle of $i^{th}$ loudspeaker in the array.

The resulting loudspeaker signals g are obtained by the following equation:

$$g = Db \quad (8)$$

where D is a Moore-Penrose pseudo-inverse of L, as represented by the following equation:

$$D = L^T(LL^T)^{-1} \quad (9)$$

To reproduce Ambisonic sound fields binaurally, the audio processing pipeline 100 uses the concept of "virtual loudspeakers", in which loudspeaker signals are generated by decoding an Ambisonic sound field. In some embodiments, the binaural decoder 116 filters the resulting loudspeaker signals g with Head Related Transfer Functions (HRTFs) corresponding to the spatial locations of the virtual loudspeakers. Next, the binaural decoder 116 separately sums the left and right channel signals to generate a stereo binaural headphone signal. For example, to obtain the left and right ear headphone feed (e.g., 2-channel audio), the binaural decoder 116 performs a convolution based on the following equations:

$$y_L = \Sigma_{i=1}^N h_{Li} * g_i \quad (10)$$

$$y_R = \Sigma_{i=1}^N h_{Ri} * g_i \quad (11)$$

where $h_{Li}$ and $h_{Ri}$ are time-domain representations of the HRTFs (e.g., Head Related Impulse Responses or HRIRs, for left and right channels, respectively) corresponding to the $i^{th}$ loudspeaker location, $g_i$ is the $i^{th}$ loudspeaker signal feed, and * denotes the convolution process.

In various embodiments, the encoder 106 encodes the mono sound sources 102 into a Higher Order Ambisonics (HOA) sound field by evaluating at runtime a number (e.g., 9, 16, or more) of higher order Spherical Harmonic (SH) functions at given azimuth and elevation angles. To avoid high computational cost of these evaluations, a lookup table with pre-computed SH values (e.g., SH coefficients table 114) is utilized. However, given a high spatial resolution of human hearing (e.g., 1 degree), pre-computation and storage costs of such large multi-dimensional tables would be prohibitively large for encoding HOA signals. Accordingly, as described in further detail herein, the SH coefficient table 114 more efficiently stores spherical harmonics based on the symmetries of SH functions, thereby reducing storage and pre-computation costs.

Figure 2:
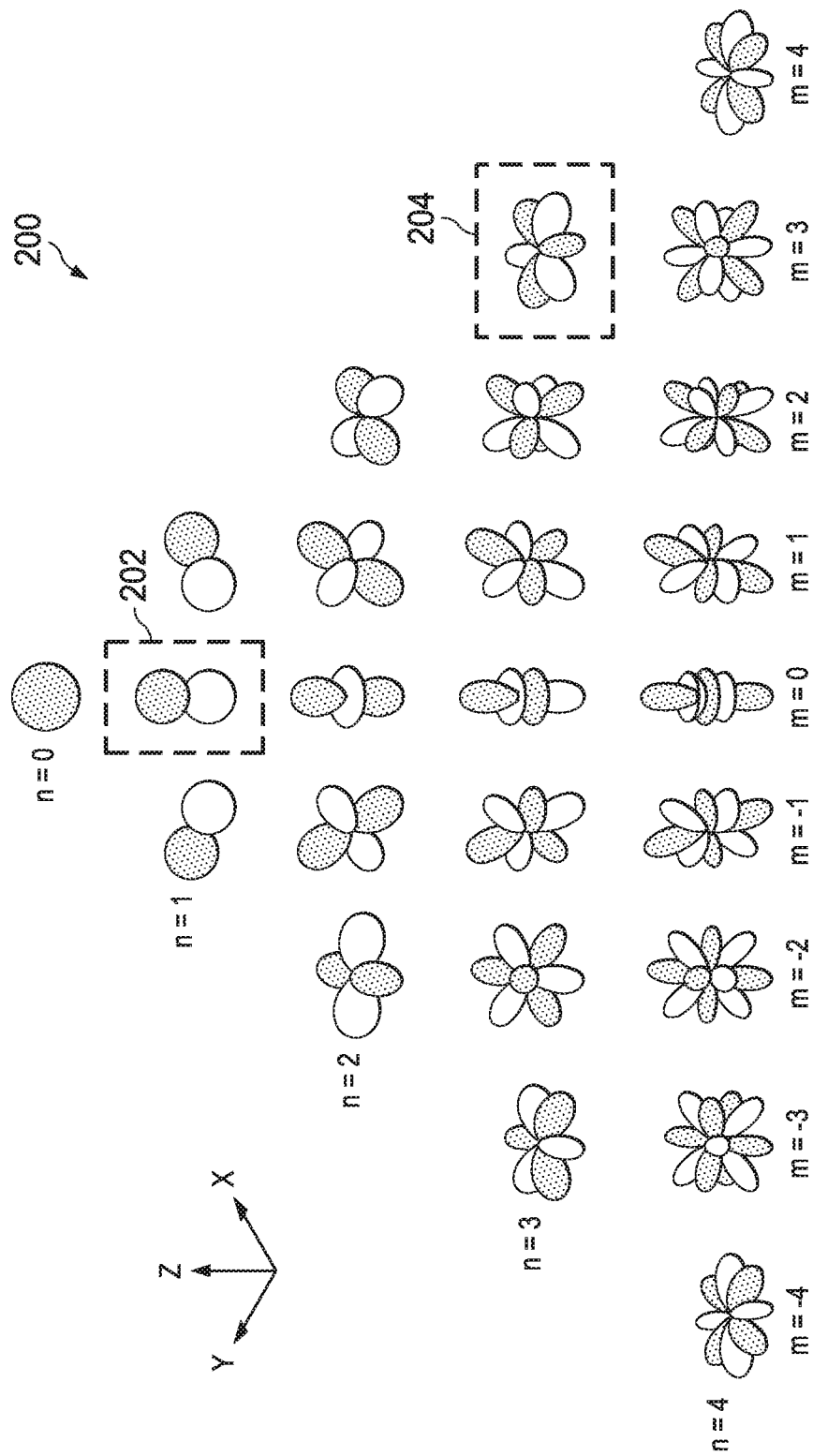
FIG. 2 is a diagram illustrating spherical harmonic basis functions in accordance with some embodiments.

FIG. 2 is a diagram illustrating spherical harmonic basis functions 200 from the zero order (n=0) to the fourth order (n=4) in accordance with some embodiments. In FIG. 2, the spherical harmonic basis functions 200 are shown in three-dimensional coordinate space with both the order and the degree shown. Based on the order (n) value range of (0,4), the corresponding degree (m) value range of FIG. 2 is (−4,4). Spherical harmonic functions can be symmetric against the x, y, and/or z Cartesian axes. For example, the equation $Y_n^m(\phi,\theta) = Y_n^m(-\phi,\theta)$ indicates that $Y_n^m(\theta,\phi)$ is symmetric with respect to the sagittal plane (e.g., left-right symmetry) but at the same time is anti-symmetric with respect to the horizontal plane (e.g., up-down anti-symmetry), and thus $Y_n^m(\phi,\theta) = (\phi,-\theta)$. A spherical harmonic which exhibits the above properties is, for example, spherical harmonic function 202 of FIG. 2, representing the spherical harmonic $Y_1^0(\phi,\theta)$ with ACN=2, which is front-back symmetric, left-right symmetric, but up-down anti-symmetric. It is also possible that a spherical harmonic is left-right anti-symmetric, front-back anti-symmetric, and up-down symmetric. For example, the equation $Y_n^m(\phi,\theta) = -Y_n^m(\phi,-\theta)$ indicates that a spherical harmonic is left-right anti-symmetric, front-back anti-symmetric, and up-down symmetric if n and m are odd and when n=m, such as for spherical harmonic function 204 of FIG. 2, representing the spherical harmonic function $Y_3^3(\phi,\theta)$ In general, symmetry and anti-symmetry-related sign flip for a given spherical harmonic $Y_n^m(\theta,\phi)$ with respect to the y, z, and x Cartesian axes, respectively, is represented by:

$$\xi_y(n, m) = \begin{cases} 1 & \text{if } m \geq 0 \\ -1 & \text{if } m < 0 \end{cases} \quad (12)$$

$$\xi_z(n, m) = (-1)^{n+m} \quad (13)$$

$$\xi_x(n, m) = \begin{cases} (-1)^m & \text{if } m \geq 0 \\ -(-1)^{|m|} & \text{if } m < 0 \end{cases} \quad (14)$$

where $\xi$ represents a symmetry-related phase coefficient for the respective axes. Therefore, by pre-computing and storing only one sphere quadrant of the spherical harmonic coefficients, the above symmetry information provides the basis for retrieving an arbitrary spherical harmonic coefficient of the same order and degree.

In some embodiments, whether to employ a given phase coefficient depends on which quadrant to pre-compute as well as which quadrant the sound source is located in. For example, with a pre-computed front-left-top quadrant $$\left(0 \leq (\phi, \theta) \leq \frac{\pi}{2}\right)$$

to retrieve a spherical harmonic coefficient for an arbitrary angle pair in the rear-right-bottom quadrant $$\left(-\pi \leq \phi \leq -\frac{\pi}{2}, -\frac{\pi}{2} \leq \theta \leq 0\right),$$

the following is performed:

$$Y_n^m(\phi,\theta) = \xi_y(n,m)\xi_z(n,m)\xi_x(n,m)Y_n^m(\pi-|\phi|,|\theta|) \qquad (15)$$

The audio processing pipeline, as described by the various embodiments herein, applies similar logic to determine the spherical harmonic coefficients for other sound source directions (e.g., in other sphere quadrants), by dropping redundant symmetry-related phase coefficients and constraining the horizontal angle to the $$\left[0,\frac{\pi}{2}\right]$$

range. In this manner, the audio processing pipeline computes a limited size look-up table of spherical harmonic coefficients in the $$\left[0,\frac{\pi}{2}\right]$$

range at 1° resolution, as well as a symmetry look-up table. At run-time, such as when performing sound object encoding, the encoder retrieves spherical harmonic coefficients from the look-up table to encode sound source direction into the Ambisonics output.

Figure 3:
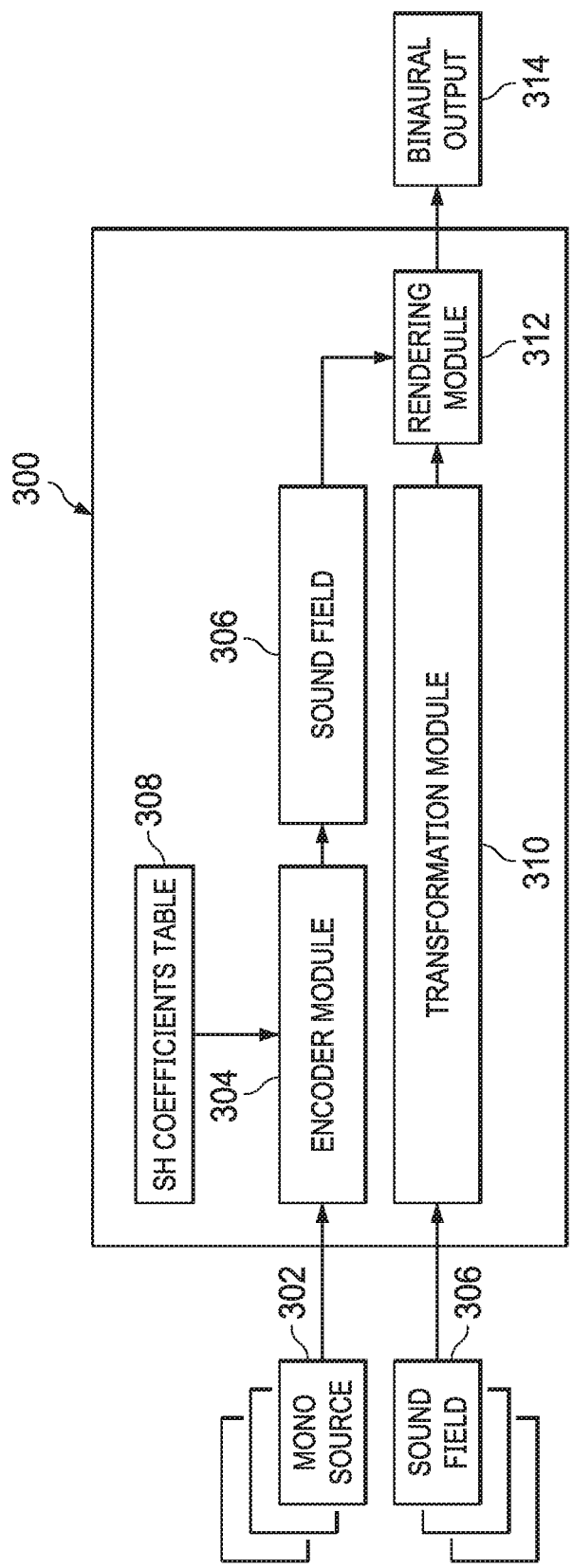
FIG. 3 is a diagram illustrating a sound object rendering pipeline for performing binaural rendering in the spherical harmonics domain in accordance with some embodiments.

FIG. 3 is a block diagram illustrating an example sound object rendering device 300 for performing binaural rendering in the spherical harmonics domain in accordance with some embodiments. The sound object rendering device 300 includes any device capable of encoding audio data, such as a desktop computer, a laptop computer, a workstation, a tablet or slate computer, a dedicated audio recording device, a cellular phone (including so-called "smart phones"), a personal media player device, a personal gaming device, or any other type of device capable of encoding audio data. While shown as a single device, i.e., sound object rendering device 300 in the example of FIG. 3, the various components or modules referenced below as being included within the sound object rendering device 300, in various embodiments, forms separate devices that are external from the sound object rendering device 300. In other words, while described in this disclosure as being performed by a single device, i.e., the sound object rendering device 300 in the example of FIG. 3, the techniques may be implemented or otherwise performed by a system comprising multiple devices, where each of these devices may each include one or more of the various components or modules described in more detail below. Accordingly, the techniques should not be limited to the example of FIG. 3.

The sound object rendering device 300 receives one or more mono sound sources 302 and provides the one or more mono sound sources 302 to an encoder module 304. The encoder module 304 encodes the one or more mono sound sources 302 into a Higher Order Ambisonics (HOA) sound field (e.g., one of the sound fields 306) based on a number (e.g., 9, 16, or more) of higher order spherical harmonic functions at given azimuth and elevation angles. Higher orders project onto more harmonics and therefore have increased spatial resolution relative to lower order Ambisonics, but also use more channels for the encoded signal. To avoid high computational cost of these evaluations, the sound object rendering device 300 utilizes a lookup table with pre-computed SH values (e.g., SH coefficients table 308).

In one embodiment, the SH coefficients table 308 includes all spherical harmonics pre-computed and stored up to the $3^{rd}$ order. To improve memory utilization optimization, in another embodiment, the SH coefficients table 308 stores only (N-channel+1)$^2$ number of components for azimuth angles $\phi$: 0:1:90; elevation angles $\theta$: 0:1:90 based on the symmetries of spherical harmonics, as discussed above in more detail relative to FIG. 2. The SH coefficients table 308 includes angles limited to the upper/left/forward quadrant only and thus provides a lookup table enabling more efficient storage and processing (e.g., encoding) of spherical harmonic signals. Additionally, the spherical harmonic coefficients may be computed to a higher order due to the reduced memory footprint resulting from storing a reduced number of components for the SH coefficients table 308.

In some embodiments, a transformation module 310 receives one or more of the sound fields 306 for performing one or more Ambisonics transformation operations prior to decoding of the Ambisonics encoded sound fields 306. An Ambisonics transformation can be represented by the following equation:

$$\tilde{b}=Tb \qquad (16)$$

where a transformed Ambisonic signal vector $\tilde{b}$ is obtained by applying a matrix T to the Ambisonic input signal vector b (e.g., the one or more of the sound fields 306). For example, in various embodiments, different types of transformations such as rotation may be applied to the Ambisonic sound field.

Each individual sound object encoded into an Ambisonic representation is assumed to be dynamic such that its position relative to a listener's head can change at an arbitrary rate and independently of other sound objects. Hence, to re-position an individual sound object in 3D space, the individual sound object just needs to be re-encoded with updated spherical harmonic coefficients. However, there are situations where rotating an Ambisonic sound field 306 is a better solution. For example, one such situation is when multiple sound objects in the Ambisonic sound field 306 have already been encoded into the Ambisonic representation using, for example, a microphone array.

In one embodiment, the transformation module 310 includes a rotator that performs a first order Ambisonic rotation that includes applying a 3×3 rotation matrix to the velocity components of the sound field 306 while keeping the pressure component unmodified. This is equivalent to a simple vector rotation. In another embodiment, the transformation module 310 includes a rotator that performs higher order Ambisonics rotation involving rotation of vectors with dimensionality higher than 3, such as by use of spherical harmonic rotation matrices computation by recursion. In other embodiments, the transformation module 310 includes modules for focusing or warping the sound field, applying reverb effects, and the like.

With the virtual loudspeaker reproduction approach discussed herein, the sound object rendering device 300 determines HRIRs corresponding to the spatial locations of an array of loudspeakers. For example, in some embodiments, a regular octagonal array of loudspeakers forms the array of loudspeakers. The sound object rendering device 300 measures HRIRs corresponding to spatial locations of all the loudspeakers required for a given decoder configuration and organizes the determined HRIRs into a virtual loudspeaker database (not shown). Subsequently, measurements are extracted from the virtual loudspeaker database for decoding/Ambisonic audio rendering.

At run-time, the rendering module 312 receives an Ambisonic sound field as input (e.g., after encoding into the spherical harmonics domain by the encoder module 304 and/or after transformation by the transformation module 310) and performs HRTF-based rendering of the sound field for listening. For example, in some embodiments, the rendering module 312 includes a binaural renderer (such as the binaural decoder 116 of FIG. 1) that decodes the input signals with HRTFs corresponding to the spatial locations of the virtual speakers 312. The rendering module 312 then convolves the decoded signals with HRIRs and sums left and right channel signals to generate the binaural output 314, thereby providing Ambisonic playback.

The sound object rendering device 300 reduces run-time complexity by pre-computing look-up tables for reducing pre-computation time and reducing the memory footprint associated with look-up tables, as discussed above. Real-time computation of SH coefficients (e.g., based on equations (5) and (6) above) is computationally intensive. Accordingly, the sound object rendering device 300 pre-computes the SH coefficients and stores the pre-computed SH coefficients in SH coefficients table 308 as a Look Up Table (LUT) or other dataset to reduce run-time complexity while reducing the memory footprint and precomputation initialization time. Thus, as described herein, symmetries of SH functions are exploited to efficiently pre-compute, store, and then index and retrieve the SH coefficients at run-time, thereby reducing the memory footprint required to store SH coefficients in SH coefficients table 308 and increasing pre-computation speed.

In this manner, the sound object rendering device 300 encodes sound objects into HOA sound fields and allows listeners to experience the sound objects to be coming from desired spatial locations (i.e., encoding of sound source directions into the sound field). However, conventional Ambisonics rendering results in a constant angular spread (i.e., sound width) of the sound source depending on the Ambisonic order and its spatial location with respect to the listener. This is a limitation, as real-life sound sources differ in terms of their sizes (e.g., size of the wings of a fly vs. engines on the wings of a plane). Changing the Ambisonic order of reproduction would result in a step-wise narrowing or widening of a sound source depending on the Ambisonic order of reproduction. However, these changes are often not feasible (for example, when a fixed order Ambisonic decoder is used) or smooth changes are required. Additionally, changes to the Ambisonic order of reproduction results in changes to relative energy ratios between sound fields thus leading to a sound object being perceived quieter or louder (or closer or more distant), which is undesirable.

In some embodiments, the sound object rendering device 300 further includes shelf filters (not shown) and a spherical harmonics re-encoder (not shown) for modeling of sound source angular spread, which has multiple uses in sound design (for example, to simulate wide or volumetric sound sources). As discussed further herein, the angular spread (i.e., width) of a sound object encoded into HOA sound fields can be controlled in a smooth way while preserving its acoustic energy (and thus avoiding loudness fluctuations).

The angular spread of an Ambisonic sound source is related to the metric of a spread of its acoustic energy across a sphere, as represented by the following equation:

$$\phi_S = \arccos(\|\vec{r}_E\|) \tag{17}$$

where $\phi_S$ is the angular spread (i.e., width) of the Ambisonic sound source in radians and $\|\vec{r}_E\|$ is the magnitude of an energy vector pointing in the direction of that Ambisonic sound source. In various embodiments, the sound object rendering device 300 utilizes the relationship of equation (17) above. However, the curve is modified for very low values of $\|\vec{r}_E\|$ (e.g., below Ambisonic order 1) so that the sound source spread reaches $2\pi$ instead of $$\frac{\pi}{2}$$

when $\|\vec{r}_E\|=0$.

Figure 4:
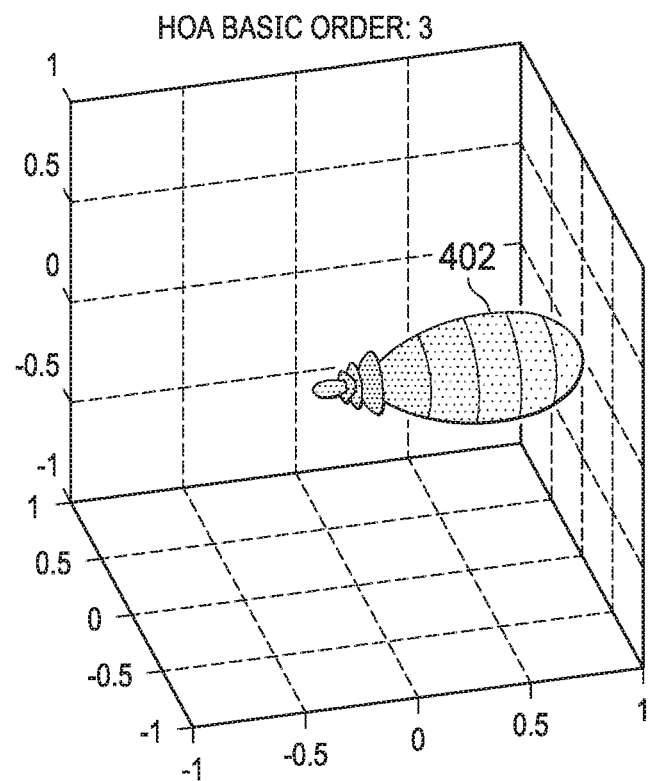
FIG. 4 is a diagram illustrating virtual microphone patterns produced using different Ambisonic decoders in accordance with some embodiments.
Figure 4:
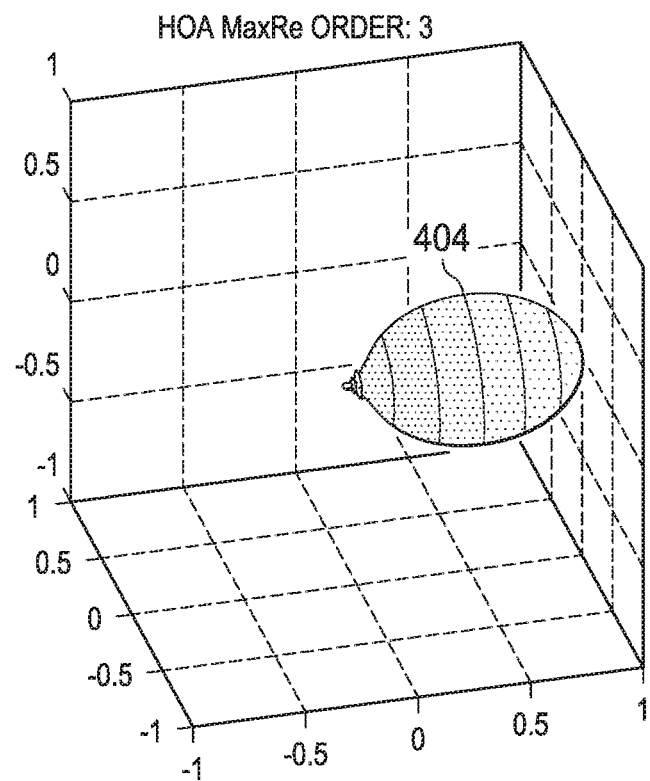

MaxRe decoding, such as described above relative to FIG. 3, maximizes energy concentration in the direction of a sound source, thus minimizing its spread. For example, FIG. 4 is a diagram illustrating virtual microphone patterns produced using different Ambisonic decoders in accordance with some embodiments. As shown, a third order basic Ambisonic decoder generates a sharper looking graph 402 than graph 404 associated with a third order MaxRe Ambisonic decoder. The maximum theoretical $\|\vec{r}_E\|$ for decoding based on a third order basic HOA source is 0.75 (i.e., $\phi_S \approx 0.7227$), corresponding to a spread of approximately 41.4°. However, the graph 402 includes visible side lobes (which correspond to signal components at directions other than the direction of a sound source, representing out-of-phase signals). The visible side lobes result in a wider overall energy spread, which translates to a wider source sound. The HOA source for the same order MaxRe decoding has $\|\vec{r}_E\| \approx 0.861$ (i.e., $\phi_S \approx 0.5336$), corresponding to a source spread of approximately 30.6°. The MaxRe source maximizes energy concentration in the direction of the sound source, thus minimizing its spread and would be sharper.

As further described herein, the sound object rendering device 300 controls the spread of the MaxRe source. Generally, to convert a basic HOA to a MaxRe HOA, the ratio of spherical harmonic coefficients in the Ambisonic signal is modified. In other words, width of a HOA sound object can be modified by applying per-order gain coefficients G(n) to the Ambisonic channels.

By knowing a desired spread for a given sound source, the relationship of equation (17) can be inverted to determine the required $\|\vec{r}_E\|$ and thus the minimum required Ambisonic order n to create such a sound source. This relationship is approximated using an exponential curve as represented by the following equation:

$$n = \lceil 13.15 e^{-2.744 \phi_S} \rceil \tag{18}$$

By using MaxRe gain coefficients (instead of basic), the sound object rendering device 300 achieves step-wise control over sound source spread. Step-wise control over sound source spread is achieved by multiplying the higher order sound field input vector by a lower order set of coefficients, which changes the relative energy ratios of channels of different orders and zeroes out higher order channel contributions. The control of width of sound sources in a stepwise manner by changing the MaxRe coefficients and zeroing of higher order channels is illustrated in graph 502 of FIG. 5. The graph 502 illustrates gain values (i.e., MaxRe gain coefficients) that each Ambisonic channel of a given order should be scaled by in order to obtain a MaxRe decoder of a given order. As shown, the curve 504 corresponds to gain values to scale each Ambisonic channel of order 0, the curve 506 corresponds to gain values to scale each Ambisonic channel of order 1, the curve 508 corresponds to gain values to scale each Ambisonic channel of order 2, the curve 510 corresponds to gain values to scale each Ambisonic channel of order 3, and the curve 512 corresponds to gain values to scale each Ambisonic channel of order 4.

Smoothness of transitions between different source spreads (as opposed to keeping a constant angular spread) helps to simulate a virtual sound source of a constant size in 3D space (e.g., a volumetric source). From the point of view of the listener, a sound source has a different spread depending on its distance to the listener. To obtain smooth transitions between different source spreads, in some embodiments, the sound object rendering device 300 numerically determines the best polynomial approximation of each MaxRe coefficient gain curve from the above-discussed FIG. 5. Equation (18) is modified to return a fractional Ambisonic order, which will be used by the encoder, as represented by the following equation:

$$n = 13.15 e^{-2.744s} \qquad (19)$$

To avoid changing the total output energy of a sound source when changing the source spread (e.g., desirable to ensure energy preservation), the sound object rendering device 300 not only applies the above-discussed gain ratio to the Ambisonic channels but also the total energy of the sound field when widening sound sources. For example, to preserve the total energy of the sound field, when using an Ambisonic order 4 in the system, the MaxRe coefficients for Ambisonic order 4 would result in the narrowest source spread with a default amplitude. Similarly, by reducing the Ambisonic order, the sound source appears wider but also quieter.

To ensure that sources sound equally loud when their spread is changed, the sound object rendering device 300 compensates for lower (fractional) order MaxRe coefficients so that the sound source is equally loud, no matter how wide it is. In some embodiments, to compute the energy-preserving MaxRe coefficients, the sound object rendering device 300 first computes the energy of the sound field at a given Ambisonic order n, which corresponds to a desired source spread. The energy is next compared to the energy of the sound field at the maximum Ambisonic order N. Subsequently, the compensation gain $\gamma_{n,N}$ is a square root of this ratio, as represented by the following equations:

$$E_{n,N} = \sum_{i=0}^{N} (2i+1) * MaxRe_{n,N}(i)^2 \qquad (20)$$

$$E_{N,N} = \sum_{i=0}^{N} (2i+1) * MaxRe_{N,N}(i)^2 \qquad (21)$$

$$\gamma_{n,N} = \sqrt{\frac{E_{N,N}}{E_{n,N}}} \qquad (22)$$

The energy-preserving set of MaxRe coefficients at an arbitrary source order n in an Ambisonic system of order N, is represented by the raw set of $MaxRe_{n,N}$ multiplied by the compensation gain $\gamma_{n,N}$, as represented by the following equation:

$$Max\hat{R}e_{n,N} = \gamma_{n,N} * MaxRe_{n,N} \qquad (23)$$

The sound object rendering device 300 applies the MaxRe correction directly to the binaural decoder using shelf-filters. This allows for significant performance improvements at run-time. Thus, the energy-preserving MaxRe coefficients need to be further normalized so that no correction is applied if the sound source spread is set to its nominal (i.e., narrowest) value. This is achieved by dividing the energy-preserving coefficients by the coefficients corresponding to the maximum Ambisonic order N, as represented by the following equation:

$$Max\hat{\hat{R}}e_{n,N} = \frac{Max\hat{R}e_{n,N}}{MaxRe_{n,N}} \qquad (24)$$

The final set of energy-preserving, normalized MaxRe gain coefficients are then pre-computed and written into a look-up table to be accessed at run-time. Thus, the sound source spread correction gains are applied at run-time.

In some embodiments, certain aspects of the techniques described above may be implemented by one or more processors of a processing system executing software. The software comprises one or more sets of executable instructions stored or otherwise tangibly embodied on a non-transitory computer readable storage medium. The software can include the instructions and certain data that, when executed by the one or more processors, manipulate the one or more processors to perform one or more aspects of the techniques described above. The non-transitory computer readable storage medium can include, for example, a magnetic or optical disk storage device, solid state storage devices such as Flash memory, a cache, random access memory (RAM) or other non-volatile memory device or devices, and the like. The executable instructions stored on the non-transitory computer readable storage medium may be in source code, assembly language code, object code, or other instruction format that is interpreted or otherwise executable by one or more processors.

A computer readable storage medium may include any storage medium, or combination of storage media, accessible by a computer system during use to provide instructions and/or data to the computer system. Such storage media can include, but is not limited to, optical media (e.g., compact disc (CD), digital versatile disc (DVD), Blu-Ray disc), magnetic media (e.g., floppy disc, magnetic tape, or magnetic hard drive), volatile memory (e.g., random access memory (RAM) or cache), non-volatile memory (e.g., read-only memory (ROM) or Flash memory), or microelectromechanical systems (MEMS)-based storage media. The computer readable storage medium may be embedded in the computing system (e.g., system RAM or ROM), fixedly attached to the computing system (e.g., a magnetic hard drive), removably attached to the computing system (e.g., an optical disc or Universal Serial Bus (USB)-based Flash memory), or coupled to the computer system via a wired or wireless network (e.g., network accessible storage (NAS)).

Note that not all of the activities or elements described above in the general description are required, that a portion of a specific activity or device may not be required, and that one or more further activities may be performed, or elements included, in addition to those described. Still further, the order in which activities are listed are not necessarily the order in which they are performed. Also, the concepts have been described with reference to specific embodiments. However, one of ordinary skill in the art appreciates that various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure.

Benefits, other advantages, and solutions to problems have been described above with regard to specific embodiments. However, the benefits, advantages, solutions to problems, and any feature(s) that may cause any benefit, advantage, or solution to occur or become more pronounced are not to be construed as a critical, required, or essential feature of any or all the claims. Moreover, the particular embodiments disclosed above are illustrative only, as the disclosed subject matter may be modified and practiced in different but equivalent manners apparent to those skilled in the art having the benefit of the teachings herein. No limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed is:

1. A method, comprising:
    receiving a set of monophonic sound inputs, wherein each of the set of monophonic sound inputs includes position and orientation information of a sound object relative to a source position; and
    encoding the set of monophonic sound inputs into a higher order ambisonic (HOA) sound field in a spherical harmonics domain based on a spherical harmonics dataset that contains spherical harmonic coefficients for only a first sphere quadrant and based on a symmetry relationship between the first sphere quadrant and at least a second sphere quadrant; and
    decoding the HOA sound field to generate a set of loudspeaker signals.

2. The method of claim 1, further comprising:
    convolving two or more of the generated set of loudspeaker signals and summing a left channel signal and a right channel signal to generate a binaural sound output.

3. The method of claim 1, further comprising:
    storing the spherical harmonics dataset as a spherical harmonics lookup table.

4. The method of claim 3, further comprising:
    computing the spherical harmonics lookup table prior to performing sound object encoding.

5. The method of claim 3, further comprising:
    determining a spherical harmonic coefficient of a second sphere quadrant based on a corresponding spherical harmonic coefficient of the first sphere quadrant from the spherical harmonics lookup table and based on the symmetry relationship.

6. The method of claim 1, further comprising:
    applying a gain correction to each of a plurality of Ambisonic channels of the HOA sound field to change a source spread of the sound object.

7. The method of claim 6, further comprising:
    applying an energy-preserving gain correction to each of a plurality of Ambisonic channels of the HOA sound field to maintain a total energy level of the HOA sound field.

8. A sound object rendering device, comprising:
    a spherical harmonics dataset including a subset of all spherical harmonic coefficients for only a first sphere quadrant; and
    an encoder to receive a set of monophonic sound inputs, wherein each of the set of monophonic sound inputs includes position and orientation information of a sound object relative to a source position, and further wherein the encoder is to encode the set of monophonic sound inputs into a higher order ambisonic (HOA) sound field in a spherical harmonics domain based on the spherical harmonics dataset and a symmetry relationship between the first sphere quadrant and at least a second sphere quadrant.

9. The sound object rendering device of claim 8, further comprising:
    a rendering module to decode the HOA sound field to generate a set of loudspeaker signals, and wherein the rendering module is further to convolve two or more of the generated set of loudspeaker signals to generate a binaural sound output.

10. The sound object rendering device of claim 8, further comprising:
    a shelf filter module to apply a gain correction to each of a plurality of Ambisonic channels of the HOA sound field to change a source spread of the sound object.

11. The sound object rendering device of claim 10, wherein the shelf filter module is further to apply an energy-preserving gain correction to each of a plurality of Ambisonic channels of the HOA sound field to maintain a total energy level of the HOA sound field.

12. A non-transitory computer-readable storage medium having stored thereon instructions that, when executed, cause one or more processors to:
    receive a set of monophonic sound inputs, wherein each of the set of monophonic sound inputs includes position and orientation information of a sound object relative to a source position;
    encode, based on a spherical harmonics dataset including spherical harmonic coefficients for only a first sphere quadrant and based on a symmetry relationship between the first sphere quadrant and at least a second sphere quadrant, the set of monophonic sound inputs into a higher order ambisonic (HOA) sound field in a spherical harmonics domain; and
    decode the HOA sound field to generate a set of loudspeaker signals.

13. The non-transitory computer-readable storage medium of claim 12, wherein the one or more processors is further to:
    convolve two or more of the generated set of loudspeaker signals and summing a left channel signal and a right channel signal to generate a binaural sound output.

14. The non-transitory computer-readable storage medium of claim 12, wherein the one or more processors is further to:
    store the spherical harmonics dataset as a spherical harmonics lookup table.

15. The non-transitory computer-readable storage medium of claim 14, wherein the one or more processors is further to:
    compute the spherical harmonics lookup table prior to performing sound object encoding.

16. The non-transitory computer-readable storage medium of claim 15, wherein the one or more processors is further to:
    compute the spherical harmonics lookup table by computing the first sphere quadrant of all spherical harmonic coefficients.

17. The non-transitory computer-readable storage medium of claim 16, wherein the one or more processors is further to:
    determine, based on a symmetry look-up table representing the symmetry relationship, a spherical harmonic coefficient of the second sphere quadrant from a corresponding spherical harmonic coefficient from the spherical harmonics lookup table.

18. The non-transitory computer-readable storage medium of claim 12, wherein the one or more processors is further to:
applying a gain correction to each of a plurality of Ambisonic channels of the HOA sound field to change a source spread of the sound object.

19. The non-transitory computer-readable storage medium of claim 18, wherein the one or more processors is further to:
apply an energy-preserving gain correction to each of a plurality of Ambisonic channels of the HOA sound field to maintain a total energy level of the HOA sound field.

20. A sound object rendering device, comprising:
a spherical harmonics dataset including spherical harmonic coefficients;
an encoder to receive a set of monophonic sound inputs, wherein each of the set of monophonic sound inputs includes position and orientation information of a sound object relative to a source position, and further wherein the encoder is to encode the set of monophonic sound inputs into a higher order ambisonic (HOA) sound field in a spherical harmonics domain based on the spherical harmonics dataset; and
a shelf filter module to apply at least one of: a gain correction to each of a plurality of Ambisonic channels of the HOA sound field to change a source spread of the sound object; and an energy-preserving gain correction to each of a plurality of Ambisonic channels of the HOA sound field to maintain a total energy level of the HOA sound field.

* * * * *